(12) United States Patent
Iwai

(10) Patent No.: US 6,897,732 B2
(45) Date of Patent: May 24, 2005

(54) AMPLIFIER

(75) Inventor: Taisuke Iwai, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 531 days.

(21) Appl. No.: 09/973,843

(22) Filed: Oct. 11, 2001

(65) Prior Publication Data
US 2002/0113656 A1 Aug. 22, 2002

(30) Foreign Application Priority Data
Feb. 19, 2001 (JP) .................................... 2001-041936

(51) Int. Cl.[7] .............................................. H03F 3/04
(52) U.S. Cl. ...................... 330/302; 330/310; 330/311; 330/307; 330/296; 330/297
(58) Field of Search ................................ 330/302, 310, 330/311, 307, 296, 297

(56) References Cited

U.S. PATENT DOCUMENTS 4,555,672 A * 11/1985 Segal ........................... 330/255
5,982,236 A * 11/1999 Ishikawa et al. ............ 330/296
6,130,579 A * 10/2000 Iyer et al. .................... 330/285

FOREIGN PATENT DOCUMENTS

JP          06053761      * 2/1994

* cited by examiner

Primary Examiner—Michael B. Shingleton
(74) Attorney, Agent, or Firm—Arent Fox, PLLC

(57) ABSTRACT

The amplifier includes two or more amplification stages. The rear amplification stage amplifies an output signal of a front stage transistor is comprised of two or more transistors connected in parallel. Bias point of the front stage transistor and a first rear stage transistor is class AB. Base bias of a second rear stage transistor is controlled according to an RF input by a rear stage DC bias control circuit. As a result, the second rear stage transistor is turned on when the output power is high, whereas it is turned off when the output power is low or medium.

27 Claims, 15 Drawing Sheets

AMPLIFIER

FIELD OF THE INVENTION

The present invention relates to an amplifier comprised of at least two stages of transistors.

BACKGROUND OF THE INVENTION

In portable terminals such as cellular phones, an output amplifier having a two-stage configuration using, for example, bipolar transistors is used. In conventional cellular phones, high efficiency operation is needed in the whole output power range. Therefore, bias points of the transistors of both the front stage and rear stage are set near the class B or class C. On the other hand, in cellular phones of the next generation or the third generation, its output power must be controlled according to the distance from the base station. Therefore, the output dynamic range is very wide as compared with the conventional technique, and high efficiency operation is demanded in the whole output power range thereof. Furthermore, there is a demand for suppression of adjacent channel leak power to a low value. For satisfying the demand, it is necessary to suppress the amplifier distortion, which becomes the major cause of the adjacent channel leak power, to a low value.

FIG. 1 is a circuit diagram showing principal parts of a conventional output amplifier. This amplifier has a two-stage configuration using bipolar transistors. This amplifier includes the input matching circuit 3 having the inductor 1 and capacitor 2, common emitter front stage transistor 4, inter-stage matching circuit 8 having the capacitors 5 and 7 and the inductor 6, common emitter rear stage transistor 9, and a not shown output matching circuit.

Base bias Vb1 of the front stage transistor 4 is supplied from the outside via an inductor 10. Collector bias Vcc1 of the front stage transistor 4 is supplied from the outside via an inductor 11. Base bias Vb2 of the rear stage transistor 9 is supplied from the outside via an inductor 12. Collector bias Vcc2 of the rear stage transistor 9 is supplied from the outside via an inductor 13. When this amplifier is used in a cellular phone or the like as described above, bias points of both the front stage transistor 4 and the rear stage transistor 9 are set near the class B or class C in order to implement high efficiency operation in the whole output power range.

RF signal (RFin) supplied from the outside is input to the base of the front stage transistor 4 via the input matching circuit 3. The collector output of the front stage transistor 4 is supplied to the base of the rear stage transistor 9 via the inter-stage matching circuit 8. RF signal (RFout) supplied from the collector of the rear stage transistor 9 is output to the outside via the output matching circuit. Numeral 14 denotes an RF signal input terminal, 15 denotes an RF signal output terminal, 16 denotes an application terminal of the base bias Vb1, 17 denotes an application terminal of the collector bias Vcc1, 18 denotes an application terminal of the base bias Vb2, and 19 denotes an application terminal of the collector bias Vcc2.

For making the conventional amplifier with a high efficiency over the whole output power range of the output dynamic range that is wider as compared with the conventional technique, it is necessary to set the bias points of the front stage transistor 4 and the rear stage transistor 9 at those of the class B or class C. By doing so, however, a gain change occurs as the output increases, resulting in a degraded distortion characteristic of the amplifier. On the other hand, for making the amplifier operate with low distortion, it is necessary to set the bias points at those of the class AB. In that case, however, the efficiency becomes lower when the output power is low or medium. Therefore, it is difficult to use the conventional amplifier in a cellular phone or the like of the next generation or the third generation, which demands both high efficiency operation and low distortion operation in a wide output dynamic range.

SUMMARY OF THE INVENTION

It is an object of the present invention to provide an amplifier that satisfies the demand for both high efficiency operation and low distortion operation in-a wide output dynamic range.

The amplifier according to one aspect of the present invention includes a plurality of amplification stages. A rear amplification stage for amplifying an output signal of a front amplification stage is comprised of a plurality of transistors connected in parallel. A transistor constituting the front amplification stage and a part of transistors of the rear stage are made to perform operation of the class AB. The remaining transistor of the rear stage is turned on when the output power is high, whereas it is turned off when the output power is low or medium.

According to the above aspect, a transistor constituting the front amplification stage and a part of the rear stage transistors perform operation of the class AB. When the output power is low or medium, the remaining transistor of the rear stage is in the off-state. On the other hand, when the output power is high, the remaining transistor of the rear stage is in the on-state.

Other objects and features of this invention will become apparent from the following description with reference to the accompanying drawings.

DESCRIPTION OF THE PREFERRED EMBODIMENTS

Figure 1:
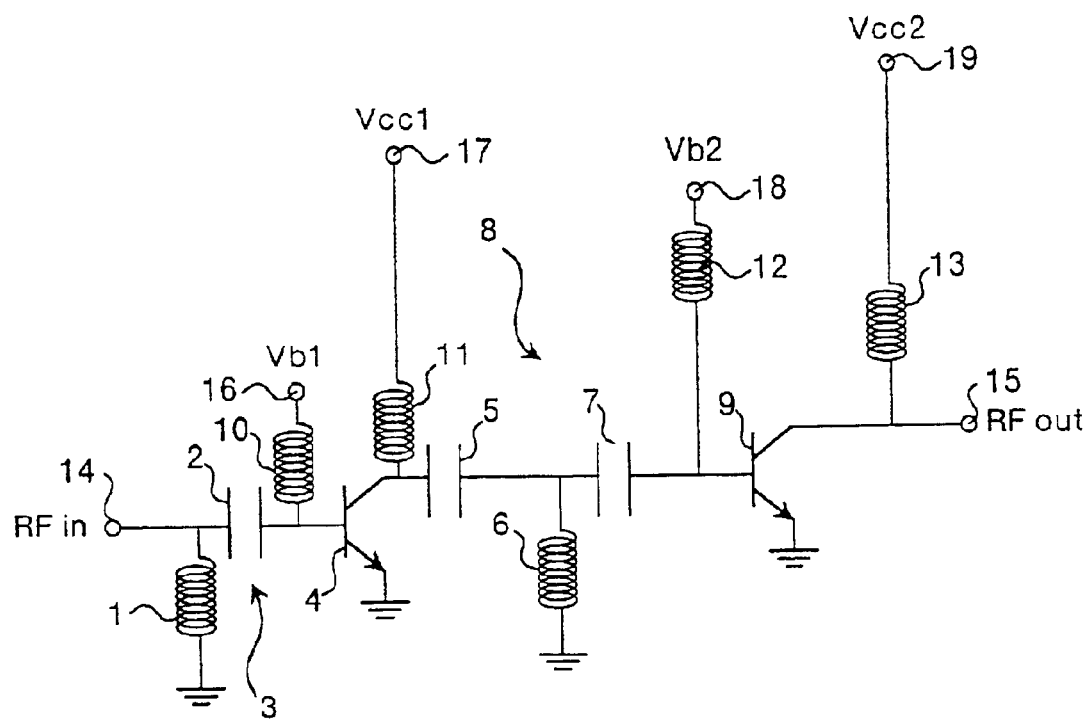
FIG. 1 is a circuit diagram showing a principal part of a conventional output amplifier.

Embodiments of the present invention will be described in detail by referring to the drawing. In the ensuing description of the embodiments, it is assumed that the present invention is applied to an amplifier having a two stage configuration using bipolar transistors.

Figure 2:
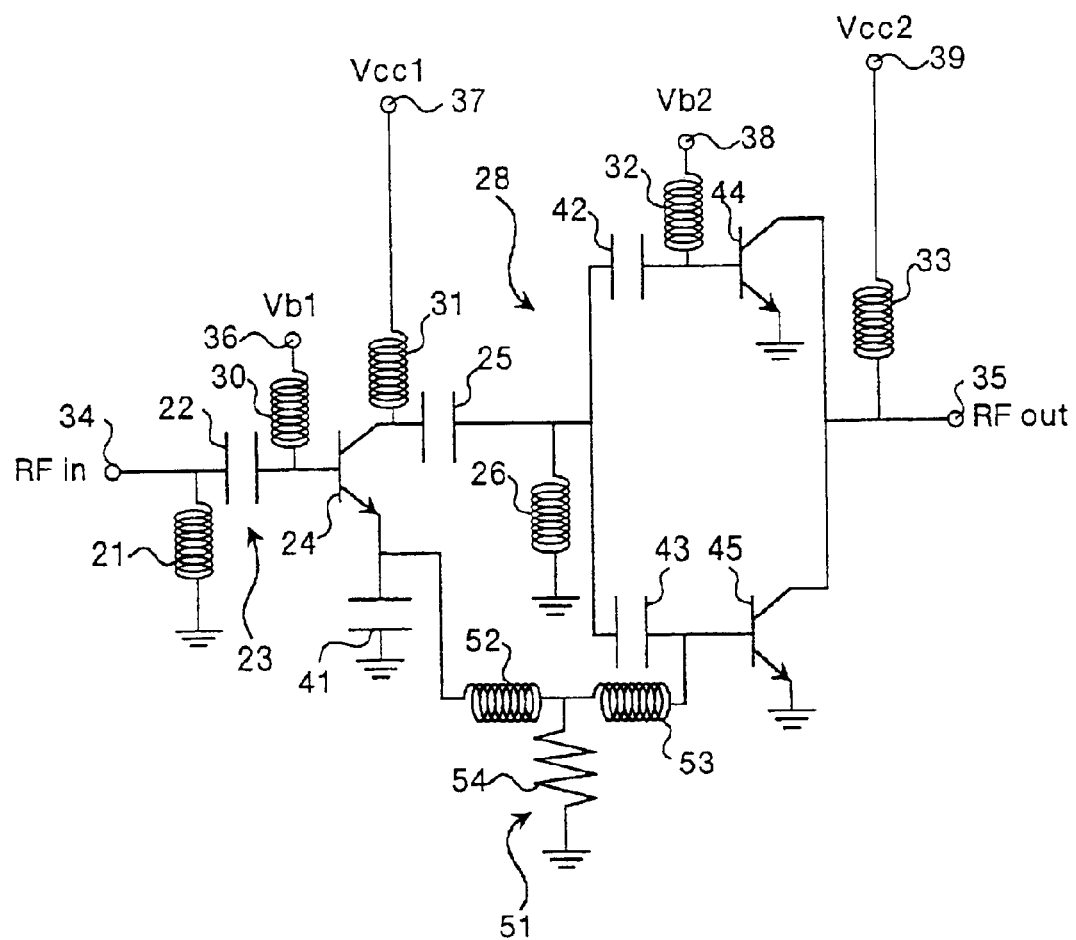
FIG. 2 is a circuit diagram showing a principal part of an output amplifier according to a first embodiment of the present invention.

FIG. 2 is a circuit diagram showing principal parts of an output amplifier according to a first embodiment of the present invention. This amplifier includes the input matching circuit 23 having the inductor 21 and the capacitor 22, front stage transistor 24 connected to the ground at its emitter via a capacitor 41, inter-stage matching circuit 28 having capacitors 25, 42 and 43 and an inductor 26, two rear stage transistors 44 and 45 connected to the ground at its emitter, rear stage DC bias control circuit 51, and a not shown output matching circuit. The input matching circuit 23, the front stage transistor 24, the inter-stage matching circuit 28, the two rear stage transistors 44 and 45, the rear stage DC bias control circuit 51, and the output matching circuit may be integrated on the same semiconductor chip, or may be disposed distributively on two or more semiconductor chips.

Base bias Vb1 of the front stage transistor 24 is supplied from the outside via an inductor 30. Collector bias Vcc1 of the front stage transistor 24 is supplied from the outside via an inductor 31. Base bias Vb2 of the first rear stage transistor 44 included in the rear stage transistors 44 and 45 is supplied from the outside via the inductor 32.

The second rear stage transistor 45 included in the rear stage transistors 44 and 45 is supplied at its base with a bias controlled by the rear stage DC bias control circuit 51. The rear stage DC bias control circuit 51 includes two AC blocking inductors 52 and 53 connected in series between the emitter of the front stage transistor 24 and the base of the second rear stage transistor 45, and a shunt resistor 54 connected between a node of the AC blocking inductors 52 and 53 and the ground.

Base bias of the second rear stage transistor 45 is determined by the product of a DC emitter current (IE) of the front stage transistor 24 and a resistance value of the shunt resistor 54. The shunt resistor 54 is set to such a resistance value that the second rear stage transistor 45 is in the off-state when the output power is low or medium and the second rear stage transistor 45 is in the on-state when the output power power is high.

Collector bias Vcc2 from the outside is supplied to the first and second rear stage transistors 44 and 45 via an inductor 33. Bias points of both the front stage transistor 24 and the first rear stage transistor 44 are set to those of the class AB.

RF signal (RFin) supplied from the outside is input to the base of the front stage transistor 24 via the input matching circuit 23. The collector output of the front stage transistor 24 is supplied to each of the bases of the first and second rear stage transistors 44 and 45 via the inter-stage matching circuit 28. Each of the collectors of the first and second rear stage transistors 44 and 45 are connected in common to an output terminal 35 via the output matching circuit, which is not showed. RF signals output from each of the collectors of the first and second rear stage transistors 44 and 45 are superposed and output to the outside via the output matching circuit, which is not showed.

When the DC emitter current (IE) of the front stage transistor 24 is small, the second rear stage transistor 45 is in the off-state. If the DC emitter current (IE) of the front stage transistor 24 increases, then the base bias of the second rear stage transistor 45 becomes large and the second rear stage transistor 45 is in the on-state. When the output power is low or medium, only the output signal of the first rear stage transistor 44 is output to the outside. When the output power is high, both the output signal of the first rear stage transistor 44 and the output signal of the second rear stage transistor 45 are output to the outside.

Numeral 34 denotes an RF signal input terminal, numeral 36 denotes an application terminal of the base bias Vb1, numeral 37 denotes an application terminal of the collector bias Vcc1, numeral 38 denotes an application terminal of the base bias Vb2, and numeral 39 denotes an application terminal of the collector bias Vcc2.

The front stage transistor 24 and the first rear stage transistor 44 perform operation of the class AB. When the output power is low or medium, the second rear stage transistor 45 is in the off-state. As compared with the conventional technique in which the two-stage amplifier is made to perform operation of the class AB, therefore, degradation of the efficiency caused when the output power is low or medium can be suppressed. Furthermore, by turning on the second rear stage transistor 45, high output operation is made possible. Furthermore, since the front stage transistor 24 and the first rear stage transistor 44 do not perform the class B operation or the class C operation, gain variation caused by an increase of output power can be suppressed and consequently low distortion operation becomes possible. As a result, an amplifier that satisfies the demands for both the high efficiency operation and low distortion operation in a wide output dynamic range can be obtained.

Figure 3:
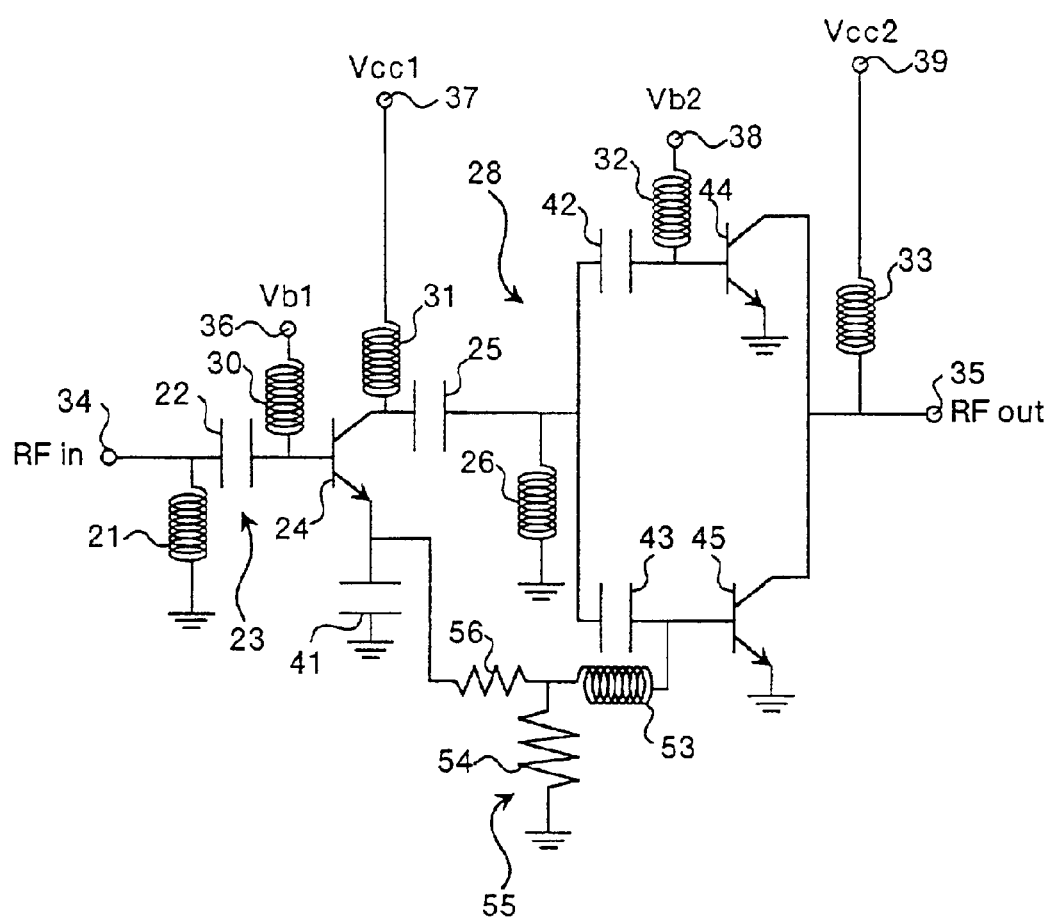
FIG. 3 is a circuit diagram showing a principal part of a variant of an output amplifier according to a first embodiment of the present invention.
Figure 4:
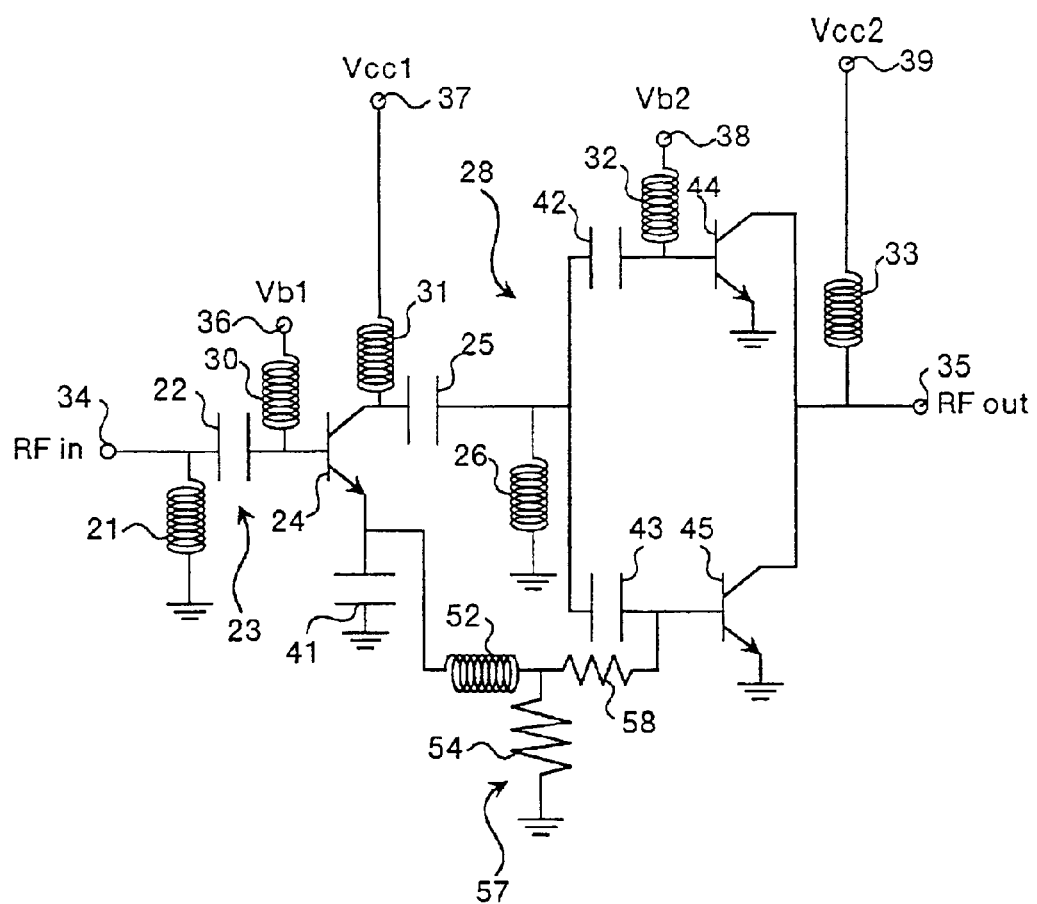
FIG. 4 is a circuit diagram showing a principal part of a variant of an output amplifier according to a first embodiment of the present invention.
Figure 5:
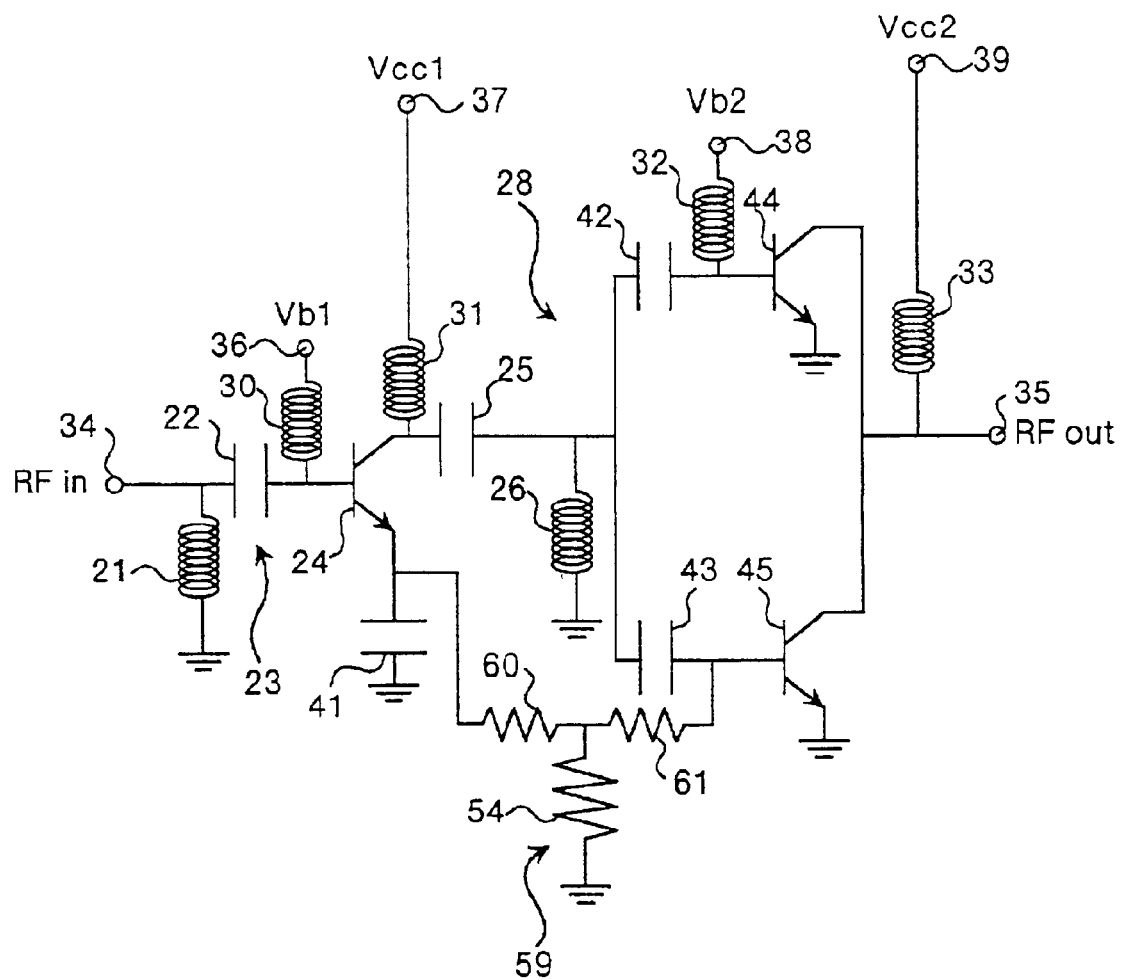
FIG. 5 is a circuit diagram showing a principal part of a variant of an output amplifier according to a first embodiment of the present invention.

Any one of rear stage DC bias control circuits 55, 57 and 59 having various configurations as respectively shown in FIG. 3 to FIG. 5 can be used instead of the rear stage DC bias control circuit 51. For example, in the rear stage DC bias control circuit 55 shown in FIG. 3, a resistor 56 is connected instead of the AC blocking inductor 52 of the emitter side of the front stage transistor 24. In the rear stage DC bias control circuit 57 shown in FIG. 4, a resistor 58 is connected instead of the AC blocking inductor 53 of the base side of the second rear stage transistor 45.

In the rear stage DC bias control circuit 59 shown in FIG. 5, resistors 60 and 61 are connected in series instead of the two AC blocking inductors 52 and 53, respectively. In the rear stage DC bias control circuit 59, the resistor 60 on the front stage transistor 24 side must have an impedance sufficiently higher than that of the capacitor 41 connected to the emitter of the front stage transistor 24 in a frequency band in use, and the resistor 61 on the second rear stage transistor 45 side must have an impedance sufficiently higher than input impedance of the second rear stage transistor 45 in the frequency band in use.

Figure 6:
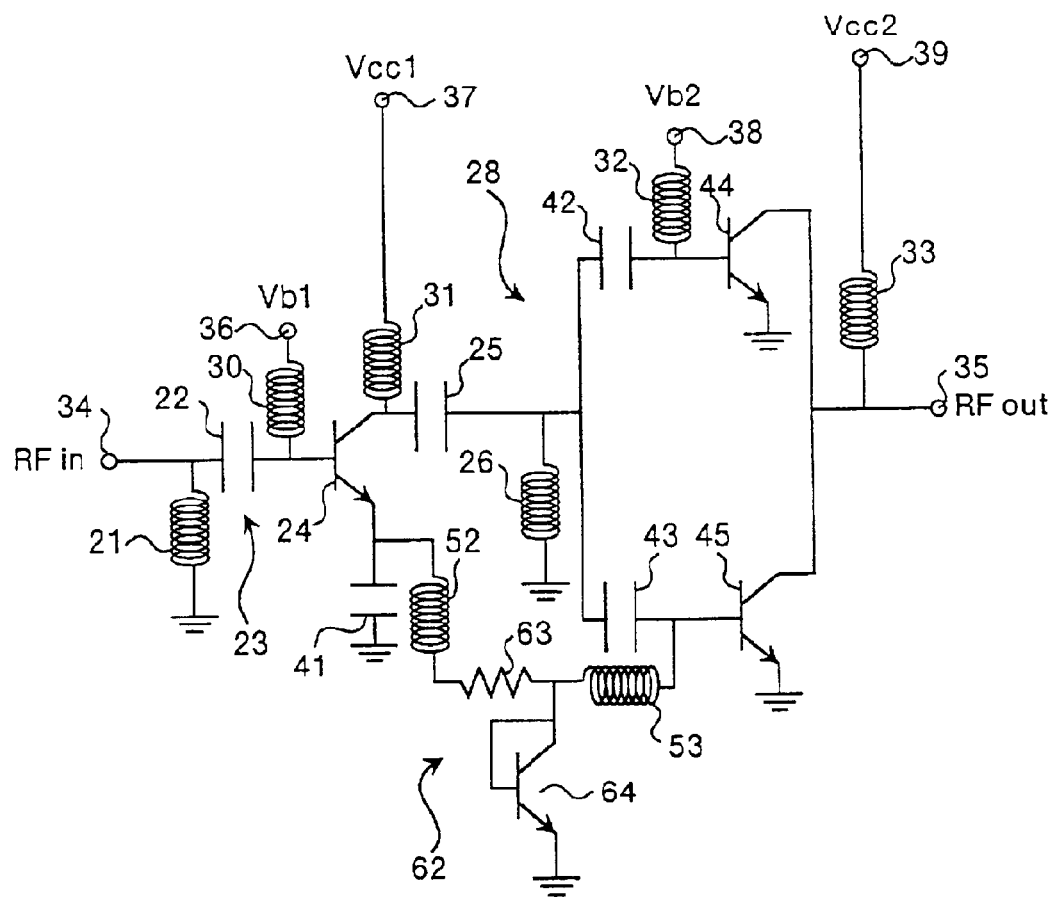
FIG. 6 is a circuit diagram showing a principal part of a variant of an output amplifier according to a first embodiment of the present invention.
Figure 7:
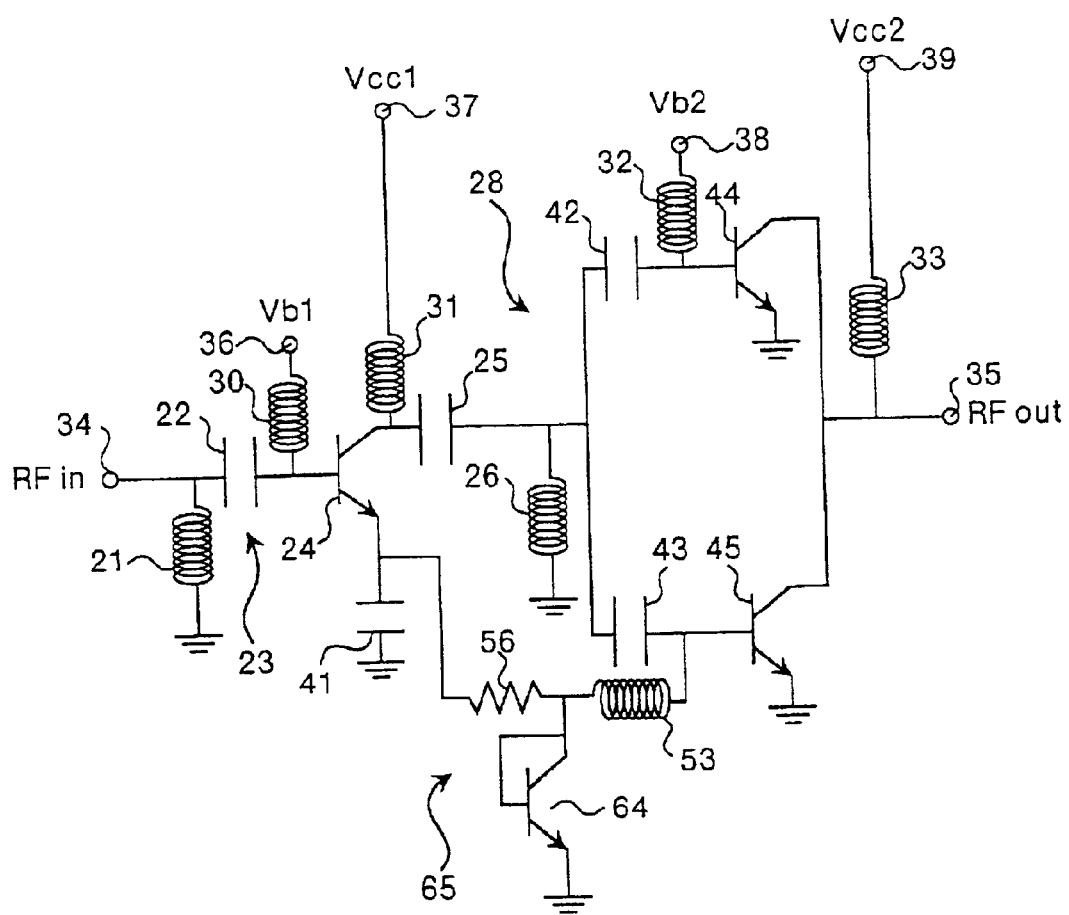
FIG. 7 is a circuit diagram showing a principal part of a variant of an output amplifier according to a first embodiment of the present invention.
Figure 8:
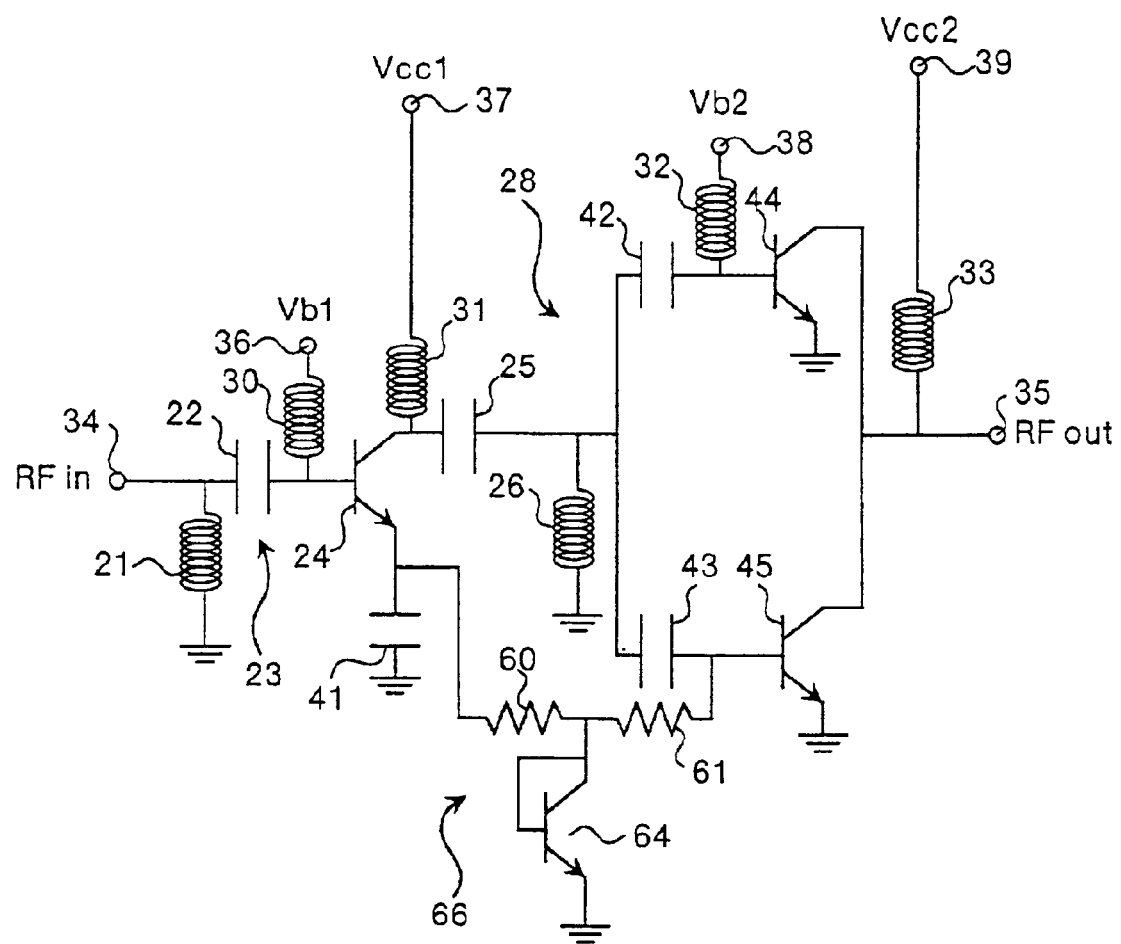
FIG. 8 is a circuit diagram showing a principal part of a variant of an output amplifier according to a first embodiment of the present invention.

Any one of rear stage DC bias control circuits 62, 65 and 66 having various configurations as respectively shown in FIG. 6 to FIG. 8 can be used instead of the rear stage DC bias control circuit 51. For example, in the rear stage DC bias control circuit 62 shown in FIG. 6, a resistor 63 is connected in series between two AC blocking inductors 52 and 53, and instead of the shunt resistor 54 a shunt diode 64 is connected to a node between the resistor 63 and the AC blocking inductor 53 on the second rear stage transistor 45 side.

In the rear stage DC bias control circuit 65 shown in FIG. 7, a resistor 56 is connected instead of the AC blocking inductor 52 on the emitter side of the front stage transistor 24 and a shunt diode 64 is connected instead of the shunt resistor 54. In the rear stage DC bias control circuit 66 shown in FIG. 8, resistors 60 and 61 are connected in series instead of the two AC blocking inductors 52 and 53, and a shunt diode 64 is connected instead of the shunt resistor 54.

In the rear stage DC bias control circuit 66 as well, the resistor 60 on the front stage transistor 24 side must have an impedance sufficiently higher than that of the capacitor 41 connected to the emitter of the front stage transistor 24 in a frequency band in use, and the resistor 61 on the second rear stage transistor 45 must have an impedance sufficiently higher than input impedance of the second rear stage transistor 45 in the frequency band in use, as described with reference to FIG. 5. If the shunt diode 64 is used instead of the shunt resistor 54 as shown in FIGS. 6 to 8, the current variation of the second rear stage transistor 45 caused by a temperature rise can be suppressed. In other words, each of the rear stage DC bias control circuits 62, 65 and 66 constitutes a temperature compensated self bias circuit.

Figure 9:
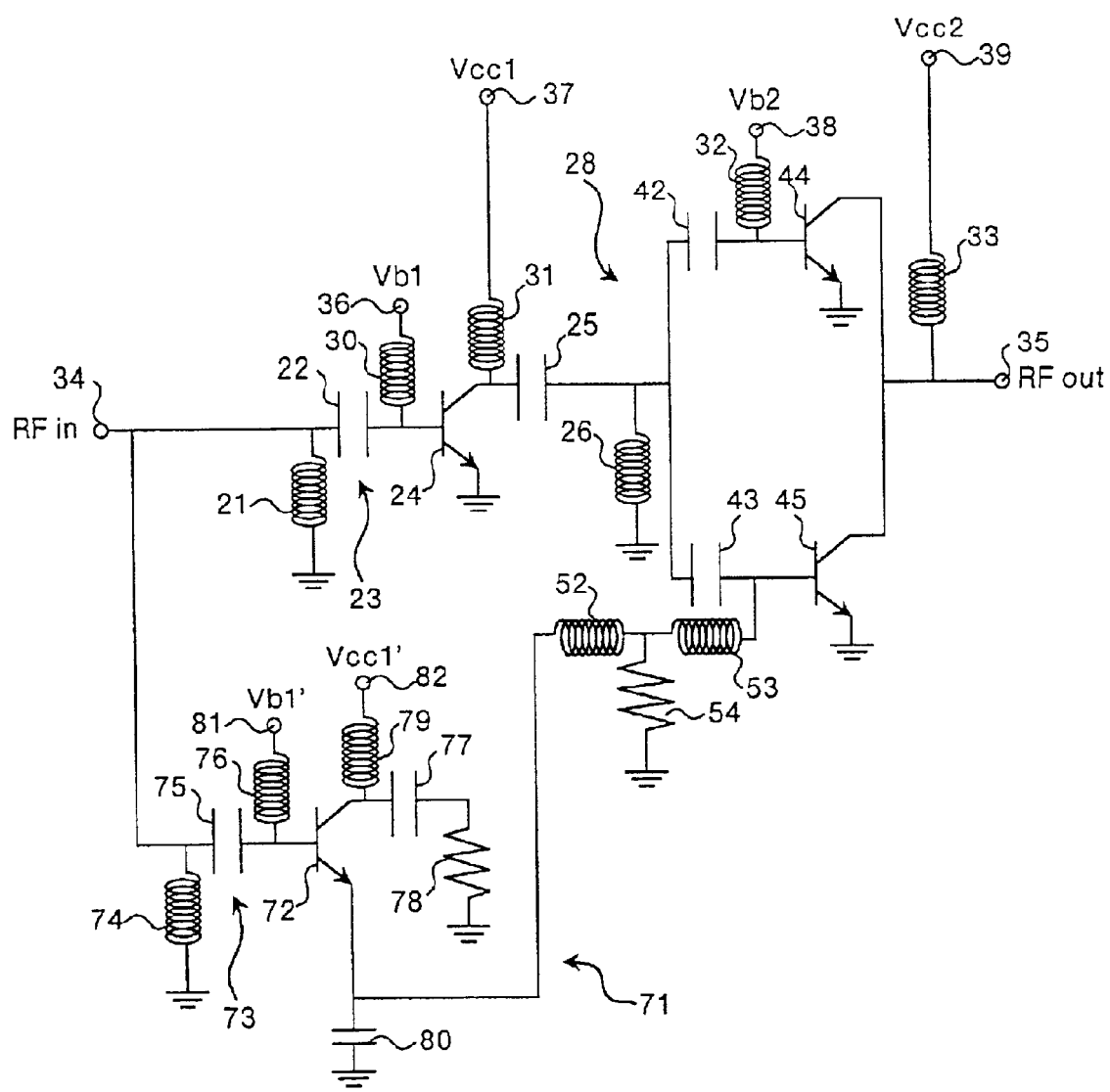
FIG. 9 is a circuit diagram showing a principal part of an output amplifier according to a second embodiment of the present invention.

FIG. 9 is a circuit diagram showing principal parts of an output amplifier according to a second embodiment of the present invention. The second embodiment differs from the first embodiment mainly in the following two points. First, instead of the rear stage DC bias control circuit 51 utilizing the front stage transistor 24, a rear stage DC bias control circuit 71 having a control transistor 72 for controlling the base bias of the second rear stage transistor 45 is provided. Secondly, an input matching circuit 73 is provided before the control transistor 72. The second embodiment is the same as the first embodiment in the remaining configuration. Therefore, the same components as those of the first embodiment are denoted by like numerals, and description thereof will be omitted. Only the configuration that is different from that of the first embodiment will now be described.

The input matching circuit 73 includes an inductor 74 and a capacitor 75. An RF signal supplied from an input terminal 34 is supplied to the front stage transistor 24 at its base via an input matching circuit 23. In addition, the RF signal is supplied to the control transistor 72 as well at its base via another input matching circuit 73. A base bias Vb1' of the control transistor 72 is supplied from the outside via an inductor 76.

Between the collector of the control transistor 72 and the ground, a capacitor 77 and a resistor 78 are connected in series in order from the collector. A collector bias Vcc1' of the control transistor 72 is supplied from the outside via an inductor 79. The control transistor 72 is connected to the ground at its emitter via a capacitor 80. Between the emitter of the control transistor 72 and the base of the second rear stage transistor 45, two AC blocking inductors 52 and 53 are connected in series. Between a node of the AC blocking inductors 52 and 53 and the ground, a shunt resistor 54 is connected. The rear stage DC bias control circuit 71 includes the control transistor 72, the capacitors 77 and 80, the inductors 52, 53 and 79, and the resistors 54 and 78.

Base bias of the second rear stage transistor 45 is determined by the product of a DC emitter current (IE) of the control transistor 72 and a resistance value of the shunt resistor 54. The shunt resistor 54 is set to such a resistance value that the second rear stage transistor 45 is in the off-state when the output power is low or medium and the second rear stage transistor 45 is in the on-state when the output power is high. When the DC emitter current (IE) of the control transistor 72 is small, therefore, the second rear stage transistor 45 is in the off-state. If the DC emitter current (IE) of the control transistor 72 increases, then the base bias of the second rear stage transistor 45 becomes large and the second rear stage transistor 45 turns on.

The input matching circuits 23 and 73, the front stage transistor 24, the inter-stage matching circuit 28, the two rear stage transistors 44 and 45, the rear stage DC bias control circuit 71, and an output matching circuit, which is not showed, may be integrated on the same semiconductor chip, or may be disposed distributively on two or more semiconductor chips. In FIG. 9, numeral 81 denotes an application terminal of the base bias Vb1' and numeral 82 denotes an application terminal of the collector bias Vcc1'.

The front stage transistor 24 and the first rear stage transistor 44 perform operation of the class AB in the same way as the first embodiment. When the output power is low or medium, the second rear stage transistor 45 is in the off-state. On the other hand, when the output power is high, the second rear stage transistor 45 is in the on-state. As a result, an amplifier that satisfies the demand for both the high efficiency operation and low distortion operation in a wide output dynamic range can be obtained.

Figure 10:
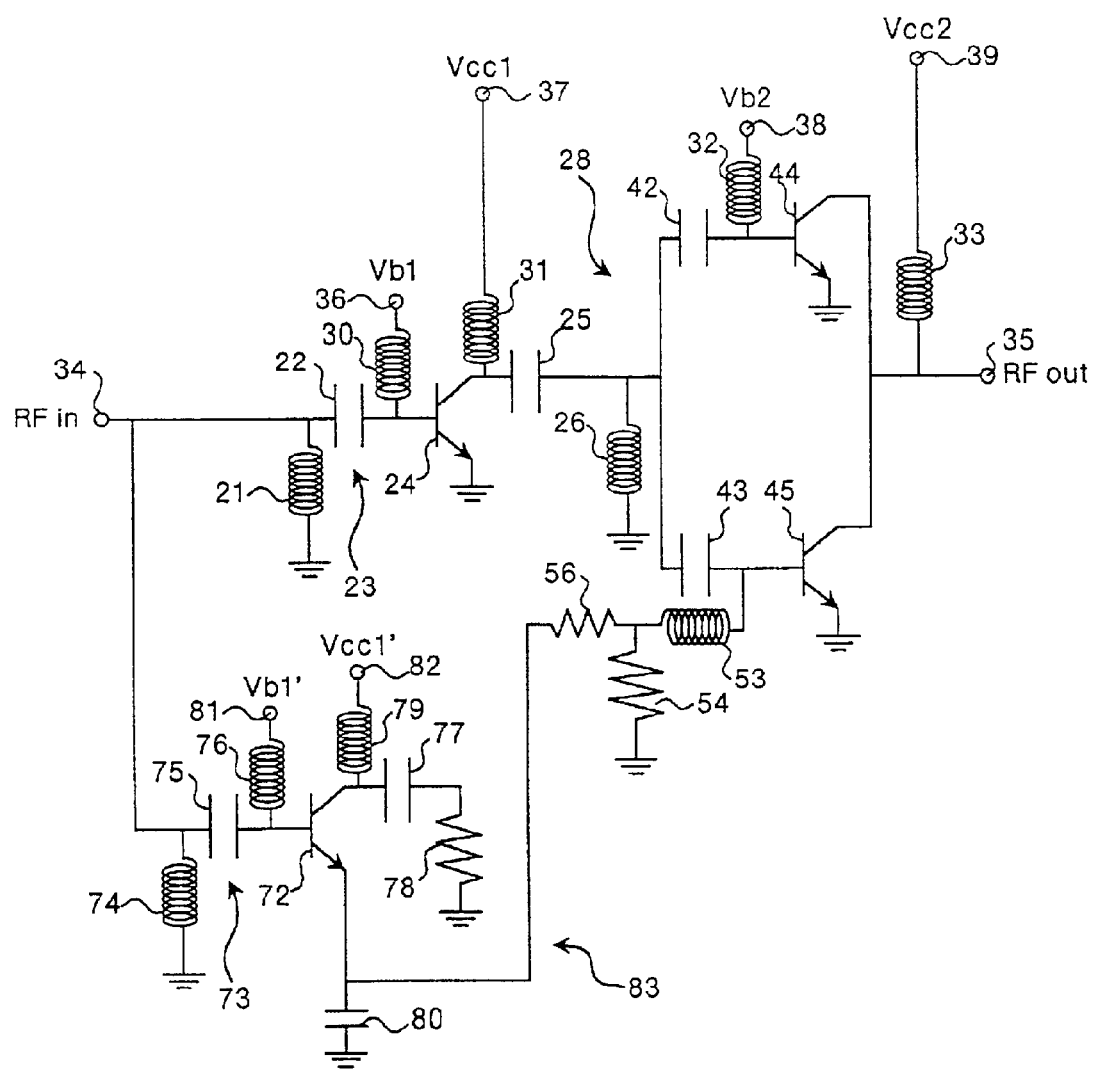
FIG. 10 is a circuit diagram showing a principal part of a variant of an output amplifier according to a second embodiment of the present invention.
Figure 11:
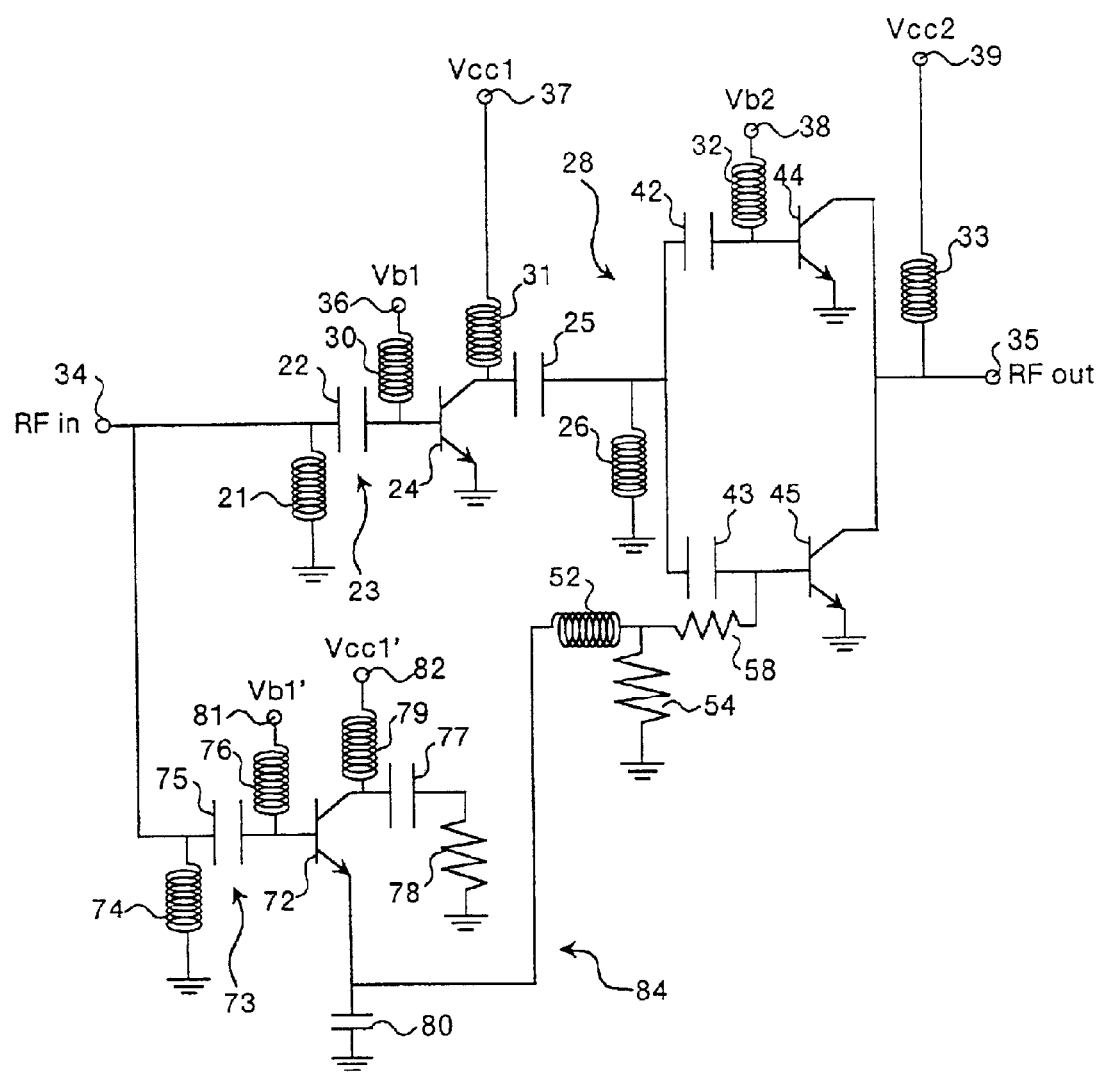
FIG. 11 is a circuit diagram showing a principal part of a variant of an output amplifier according to a second embodiment of the present invention.
Figure 12:
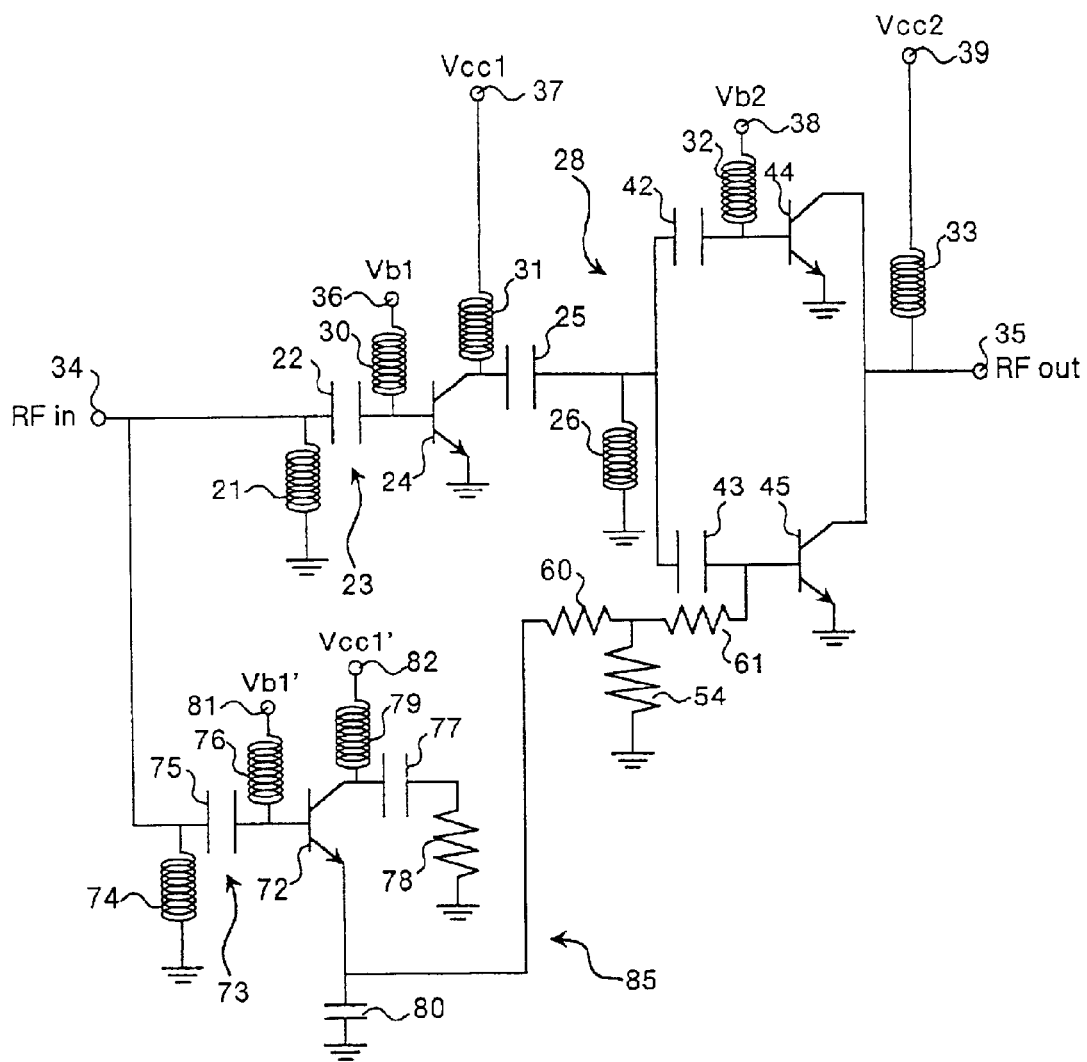
FIG. 12 is a circuit diagram showing a principal part of a variant of an output amplifier according to a second embodiment of the present invention.

Any one of rear stage DC bias control circuits 83, 84 and 85 having various configurations as respectively shown in FIGS. 10, 11 and 12 can be used instead of the rear stage DC bias control circuit 51. For example, in the rear stage DC bias control circuit 83 shown in FIG. 10, a resistor 56 is connected instead of the AC blocking inductor 52 on the emitter side of the control transistor 72. In the rear stage DC bias control circuit 84 shown in FIG. 11, a resistor 58 is connected instead of the AC blocking inductor 53 on the base side of the second rear stage transistor 45.

In the rear stage DC bias control circuit 85 shown in FIG. 12, resistors 60 and 61 are connected in series instead of the two AC blocking inductors 52 and 53. In the rear stage DC bias control circuit 85, the resistor 60 on the control transistor 72 side must have an impedance sufficiently higher than that of the capacitor 80 connected to the emitter of the control transistor 72 in a frequency band in use, and the resistor 61 on the second rear stage transistor 45 side must have an impedance sufficiently higher than input impedance of the second rear stage transistor 45 in the frequency band in use.

Figure 13:
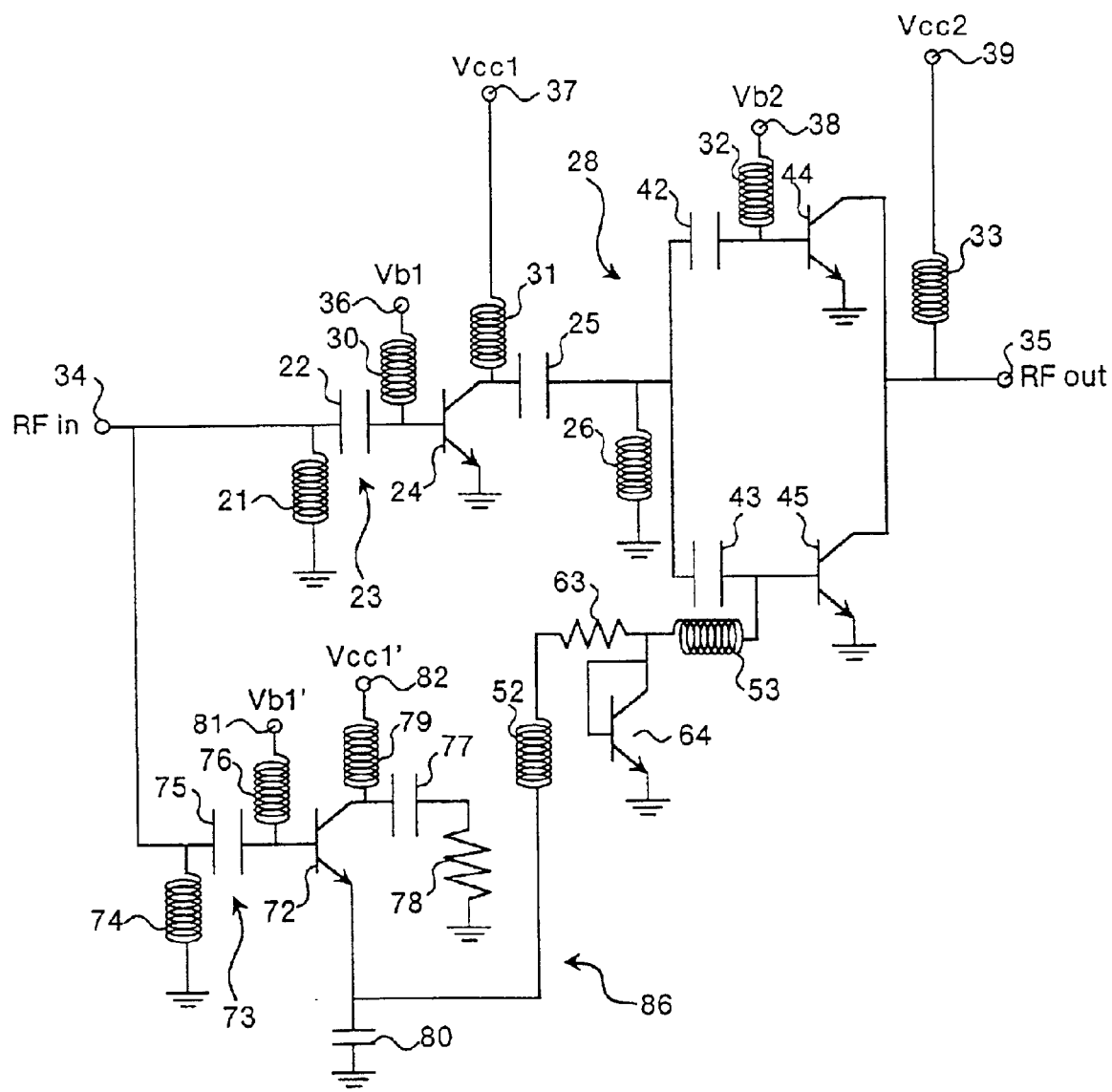
FIG. 13 is a circuit diagram showing a principal part of a variant of an output amplifier according to a second embodiment of the present invention.
Figure 14:
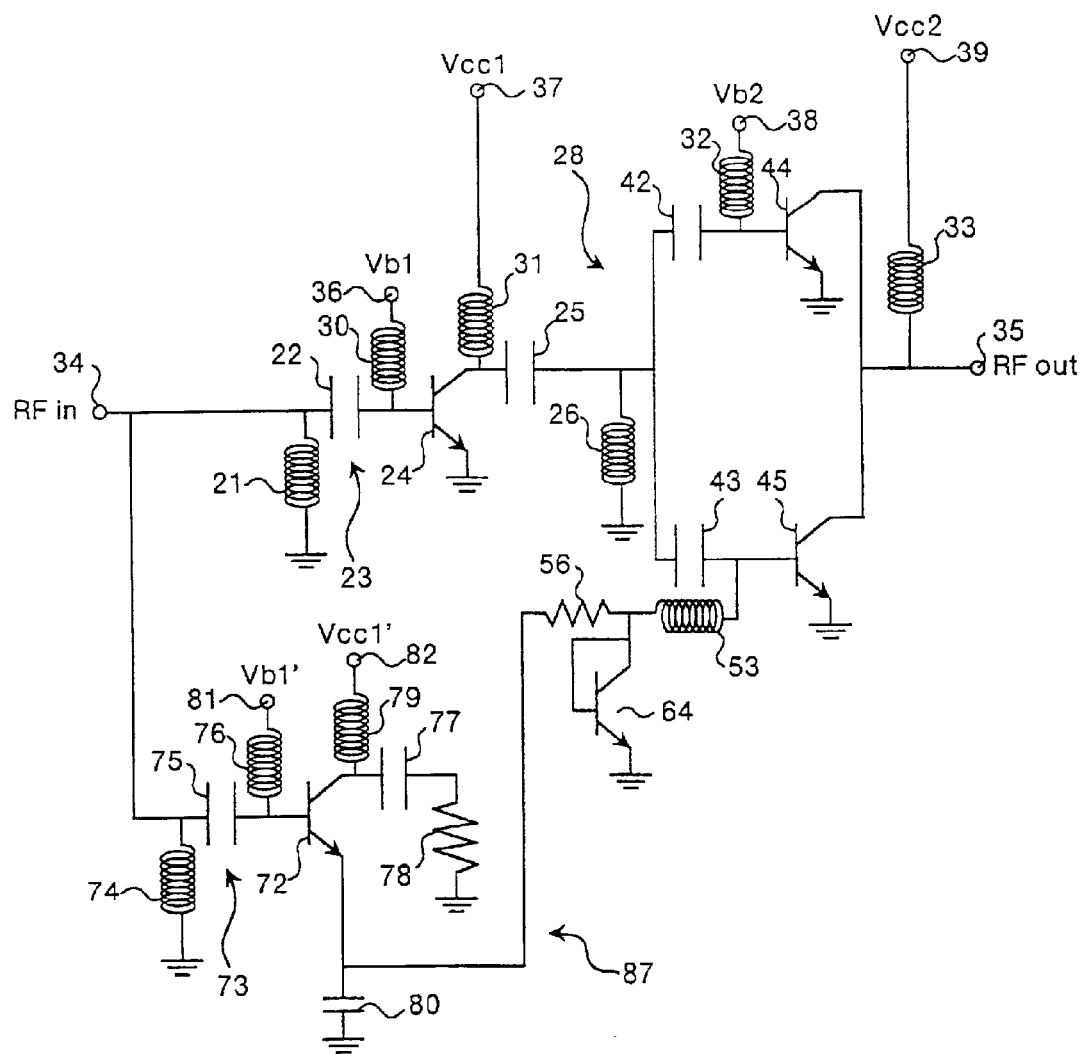
FIG. 14 is a circuit diagram showing a principal part of a variant of an output amplifier according to a second embodiment of the present invention.
Figure 15:
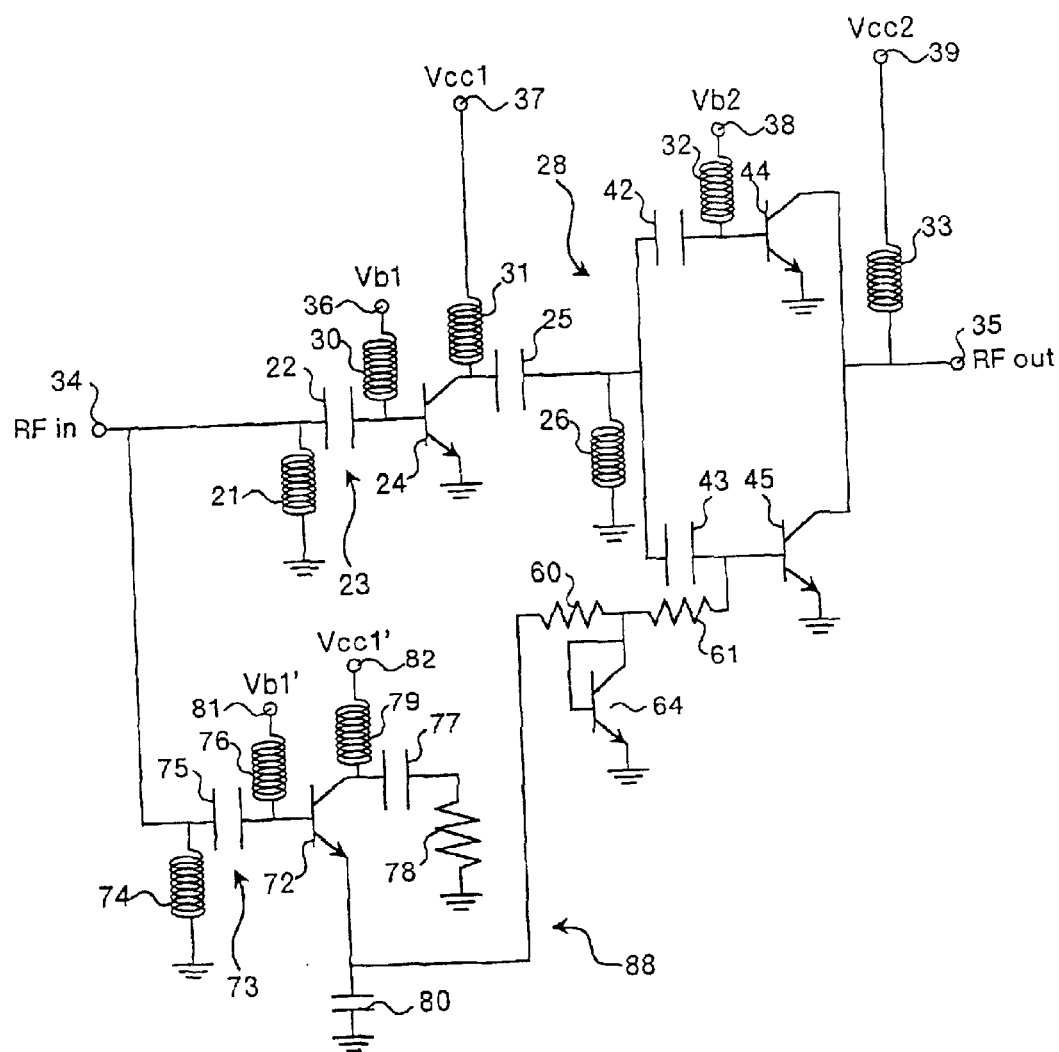
FIG. 15 is a circuit diagram showing a principal part of a variant of an output amplifier according to a second embodiment of the present invention.

Any one of rear stage DC bias control circuits 86, 87 and 88 having various configurations as respectively shown in FIGS. 13, 14 and 15 can be used instead of the rear stage DC bias control circuit 51. For example, in the rear stage DC bias control circuit 86 shown in FIG. 13, a resistor 63 is connected in series between two AC blocking inductors 52 and 53, and instead of the shunt resistor 54 a shunt diode 64 is connected to a node between the resistor 63 and the AC blocking inductor 53 on the second rear stage transistor 45 side.

In the rear stage DC bias control circuit 87 shown in FIG. 14, a resistor 56 is connected instead of the AC blocking inductor 52 on the emitter side of the control transistor 72 and a shunt diode 64 is connected instead of the shunt resistor 54. In the rear stage DC bias control circuit 88 shown in FIG. 15, resistors 60 and 61 are connected in series instead of the two AC blocking inductors 52 and 53, and a shunt diode 64 is connected instead of the shunt resistor 54.

In the rear stage DC bias control circuit 88 as well, the resistor 60 on the control transistor 72 side must have an impedance sufficiently higher than that of the capacitor 80 connected to the emitter of the control transistor 72 in a frequency band in use, and the resistor 61 on the second rear stage transistor 45 must have an impedance sufficiently higher than input impedance of the second rear stage transistor 45 in the frequency band in use, as described with reference to FIG. 12. If the shunt diode 64 is used instead of the shunt resistor 54 as shown in FIGS. 13 to 15, the current variation of the second rear stage transistor 45 caused by a temperature rise can be suppressed.

In the present invention, various modifications can be made on the foregoing description. For example, the number of stages of the amplifier is not limited to two, but it may be three or more. The second or a subsequent amplification stage may include three or more transistors connected in parallel. Instead of bipolar transistors, field effect transistors may also be used.

According to the present invention, a transistor constituting a front amplification stage and a part of transistors constituting a rear amplification stage perform class AB operation, and when the output power is low or medium, the remaining transistor of the rear stage is in the off-state. As compared with the conventional technique in which the multi-stage amplifier is made to perform operation of the class AB, therefore, degradation of the efficiency caused when the output power is low or medium can be suppressed. Furthermore, by turning on the remaining transistor of the rear stage, high output operation is made possible. Furthermore, since the front stage transistor and a part of the rear stage transistors perform neither the class B operation nor the class C operation, gain variation caused by an increase of output power can be suppressed and consequently low distortion operation becomes possible. As a result, an amplifier that satisfies the demand for both the high efficiency operation and low distortion operation in a wide output dynamic range can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An amplifier comprising:
    a front amplification stage that includes a first transistor;
    a rear amplification stage which amplifies an output signal of said front amplification stage, said rear amplification stage being disposed immediately after said front amplification stage, said rear amplification stage including a plurality of amplification units connected in parallel, said plurality of amplification units include rear stage transistors; and
    a rear stage DC bias control circuit which controls a bias of a second transistor, which is one of the rear stage transistors, according to an input level of an RF signal, wherein
    one of the plurality of amplification units performs on/off switching of amplification operation according to the RF input of the front amplification stage or increase a bias current as the RF input increases, and
    said rear stage DC bias control circuit is connected between an emitter of the first transistor and a base of the second transistor and the second transistor is supplied with a bias controlled by said rear stage DC bias control circuit.

2. An amplifier comprising:
    a front stage transistor supplied with an RF signal;
    an inter-stage matching circuit;
    a rear stage transistor group having a plurality of transistors connected in parallel and supplied with an output signal of said front stage transistor via said inter-stage matching circuit; and
    a rear stage DC bias control circuit which controls a bias of a transistor that forms a part of said rear stage transistor group according to an input level of the RF signal wherein said rear stage DC bias control circuit is connected between an emitter of said front stage transistor and a base of a transistor included in said rear stage transistor group and supplied with a bias controlled by said rear stage DC bias control circuit.

3. The amplifier accordingly to claim 2, wherein said rear stage DC bias control circuit comprises AC blocking inductors connected in series between the emitter and the base, and a hunt resistor.

4. The amplifier according to claim 2, wherein said rear stage DC bias control circuit comprises an AC blocking inductor and a resistor connected in series between the emitter and the base, and a shunt resistor.

5. The amplifier according to claim 2, wherein said rear stage DC bias control circuit includes resistors connected in series between the emitter and the base, and a shunt resistor.

6. The amplifier according to claim 2, wherein said rear stage DC bias control circuit includes an AC blocking inductor and a resistor connected in series between the emitter and the base, and a shunt diode.

7. The amplifier according to claim 2, wherein said rear stage DC bias control circuit includes resistors connected in series between the emitter and the base, and a shunt diode.

8. An amplifier comprising:
    a front stage transistor supplied with an RF signal;
    an inter-stage matching circuit;
    a rear stage transistor group having a plurality of transistors connected in parallel and supplied with an output signal of said front stage transistor via said inter-stage matching circuit; and
    a rear stage DC bias control circuit which controls a bias of a transistor that forms a part of said rear stage transistor group according to an input level of the RF signal, wherein
    said rear stage DC bias control circuit is connected between an emitter of said front stage transistor and a base of a transistor included in said rear stage transistor group and supplied with a bias controlled by said rear stage DC bias control circuit.

9. The amplifier according to claim wherein 8, said rear stage DC bias control circuit includes AC blocking inductors connected in series between the source and the gate, and a shunt resistor.

10. The amplifier according to claim 8, wherein said rear stage DC bias control circuit includes an AC blocking inductor and a resistor connected in series between the source and the gate, and a shunt resistor.

11. The amplifier according to claim 8, wherein said rear stage DC bias control circuit includes resistors connected in series between the source and the gate, and a shunt resistor.

12. The amplifier according to claim 8, wherein said rear stage DC bias control circuit includes an AC blocking inductor and a resistor connected in series between the source and the gate, and a shunt diode.

13. The amplifier according to claim 8, wherein said rear stage DC bias control circuit includes resistors connected in series between the source and the gate, and a shunt diode.

14. The amplifier according to claim 2, wherein said rear stage DC bias control circuit includes a control transistor supplied with the RF signal, and said control transistor controls a bias of a transistor that forms a part of said rear stage transistor group according to an input level of the RF signal.

15. The amplifier according to claim 14, wherein said front group transistor, a transistor included in the rear transistor group and supplied with a fixed bias, and said control transistor are biased so as to perform operation of class AB.

16. The amplifier according to claim 14, wherein said rear stage DC bias control circuit further includes AC blocking inductors connected in series between an emitter of said control transistor and a base of a transistor included in said rear stage transistor group and supplied with a bias controlled by said rear stage DC bias control circuit, and a shunt resistor.

17. The amplifier according to claim 14, wherein said rear stage DC bias control circuit further includes an AC blocking inductor and a resistor connected in series between an emitter of said control transistor and a base of a transistor included in said rear stage transistor group and supplied with a bias controlled by said rear stage DC bias control circuit, and a shunt resistor.

18. The amplifier according to claim 14, wherein said rear stage DC bias control circuit further includes resistors connected in series between an emitter of said control transistor and a base of a transistor included in said rear stage transistor group and supplied with a bias controlled by said rear stage DC bias control circuit, and a shunt resistor.

19. The amplifier according to claim 14, wherein said rear stage DC bias control circuit further includes an AC blocking inductor and a resistor connected in series between an emitter of said control transistor and a base of a transistor included in said rear stage transistor group and supplied with a bias controlled by said rear stage DC bias control circuit, and a shunt diode.

20. The amplifier according to claim 14, wherein said rear stage DC bias control circuit further includes resistors connected in series between an emitter of said control transistor and a base of a transistor included in said rear stage transistor group and supplied with a bias controlled by said rear stage DC bias control circuit, and a shunt diode.

21. The amplifier according to claim 14, wherein said rear stage DC bias control circuit further includes AC blocking inductors connected in series between a source of said control transistor and a gate of a transistor included in said rear stage transistor group and supplied with a bias controlled by said rear stage DC bias control circuit, and a shunt resistor.

22. The amplifier according to claim 14, wherein said rear stage DC bias control circuit further includes an AC blocking inductor and a resistor connected in series between a source of said control transistor and a gate of a transistor included in said rear stage transistor group and supplied with a bias controlled by said rear stage DC bias control circuit, and a shunt resistor.

23. The amplifier according to claim 14, wherein said rear stage DC bias control circuit further includes resistors connected in series between a source of said control transistor and a gate of a transistor included in said rear stage transistor group and supplied with a bias controlled by said rear stage DC bias control circuit, and a shunt resistor.

24. The amplifier according to claim 14, wherein aid rear stage DC bias control circuit further includes an AC blocking inductor and a resistor connected in series between a source of said control transistor and a gate of a transistor included in said rear stage transistor group and supplied with a bias controlled by said rear stage DC bias control circuit, and a shunt diode.

25. The amplifier according to claim 14, wherein said rear stage DC bias control circuit further includes resistors connected in series between a source of said control transistor and a gate of a transistor included in said rear stage transistor group and supplied with a bias controlled by said rear stage DC bias control circuit, and a shunt diode.

26. The amplifier according to claim 2, wherein said front stage transistor, said inter-stage matching circuit, said rear stage transistor group, and the rear group DC bias control circuit are integrated on same semiconductor chip.

27. The amplifier according to claim 2, wherein said front stage transistor, said inter-stage matching circuit, said rear stage transistor group, and the rear group DC bias control circuit are provided distributively on two or more semiconductor chips.

* * * * *